United States Patent [19]

Arakawa et al.

[11] Patent Number: 4,992,845
[45] Date of Patent: Feb. 12, 1991

[54] SEMICONDUCTOR INTEGRATED CIRCUIT DEVICE HAVING INPUT/OUTPUT BUFFER CELLS EACH COMPRISING A PLURALITY OF TRANSISTOR REGIONS ARRANGED IN A SINGLE LINE

[75] Inventors: Takahiko Arakawa; Kazuhiro Sakashita; Satoru Kishida; Toshiaki Hanibuchi; Ichiro Tomioka; Masahiro Ueda; Yoshihiro Okuno, all of Hyogo, Japan

[73] Assignee: Mitsubishi Denki Kabushiki Kaisha, Tokyo, Japan

[21] Appl. No.: 294,020

[22] Filed: Jan. 6, 1989

[30] Foreign Application Priority Data

Dec. 2, 1988 [JP] Japan .................. 63-306542

[51] Int. Cl.⁵ .......................... H01L 27/02
[52] U.S. Cl. ...................... 357/42; 357/40; 357/41; 357/45
[58] Field of Search .............. 357/40, 41, 42, 45

[56] References Cited

U.S. PATENT DOCUMENTS

| 4,591,894 | 5/1986 | Kawakami | 357/42 |
| 4,651,190 | 3/1987 | Suzuki et al. | 357/41 X |
| 4,766,475 | 8/1988 | Kawashima | 357/40 |
| 4,771,327 | 9/1988 | Usui | 357/41 X |

FOREIGN PATENT DOCUMENTS

| 0093003 | 11/1983 | European Pat. Off. |
| 0147998 | 7/1985 | European Pat. Off. |
| 3427285 | 2/1985 | Fed. Rep. of Germany . |
| 62-90948 | 4/1987 | Japan . |
| 62-114259 | 5/1987 | Japan . |

OTHER PUBLICATIONS

Blumberg et al, "A 640K Transistor Sea-of-Gates 1.2μ Micron HCMOS Technology," *1988 IEEE International Solid-State Circuits Conference, Digest of Technical Papers,* Feb. 17, 1988, pp. 74-75 & 308.

*Primary Examiner*—William Mintel
*Attorney, Agent, or Firm*—Lowe, Price, LeBlanc, Becker & Shur

[57] ABSTRACT

An internal logic gate portion (3) is provided in the central portion of a semiconductor chip (1), input/output buffers (4) are provided to surround the internal logic gate portion (3), and bonding pads (2) are provided in the peripheral portions of the semiconductor chip (1) corresponding to input/output buffer cells (5) in the input/output buffer. Each of the input/output buffer cells (5) comprises an output P-MOS portion (6), an output N-MOS portion (7), an input/logic P-MOS portion (8) and an input/logic N-MOS portion (9), which are respectively arranged in a single line in the direction from the bonding pads (2) to the internal logic gate portion (3). In the above described structure, the size of each of the input/output buffer cells (5) in the pad arranging direction of the bonding pads (2) is decreased, so that the number of input/output pins can be increased according to the decreased use of space in the pad arranging direction required by each input/output buffer cell (5).

20 Claims, 17 Drawing Sheets

SEMICONDUCTOR INTEGRATED CIRCUIT DEVICE HAVING INPUT/OUTPUT BUFFER CELLS EACH COMPRISING A PLURALITY OF TRANSISTOR REGIONS ARRANGED IN A SINGLE LINE

BACKGROUND OF THE INVENTION

1. Field of the Invention

The present invention relates generally to semiconductor integrated circuit devices, and more particularly, to a semiconductor integrated circuit device having input/output buffer cells each comprising a plurality of transistor regions arranged in a single line.

2. Description of the Background Art

As integration density of a logic integrated circuit is increased, the extension of developing period and the increase in developing cost have conventionally become problems. In order to solve such problems, a gate array has been recently employed to form a desired logic circuit as an LSI (Large-Scale Integrated Circuit). The gate array is manufactured by a manufacturing method of a master slice type comprising the preceding process referred to as a master process and the succeeding process referred to as a slice process. Elements such as a transistor, a diode and a register which are common to many kinds of semiconductor device are first formed in a chip in the master process and subsequently, interconnections for a signal and a power supply which are peculiar to the selected kinds of semiconductor device are provided in the slice process.

Thus, an LSI chip manufactured according to the usage comprises an internal logic gate region, an interconnection region and an input/output buffer region. The internal logic gate region is a region in which gates (basic cells) are regularly arranged, an interconnection region is a region for connecting the gates to each other, and the input/output buffer region is a region in which there are disposed input/output buffer cells each functioning as an interface between a logic circuit achieved in the internal logic gate region and another element outside of the LSI.

In the input/output buffer region, a transistor having larger driving ability than that of a transistor used in the internal logic gate region is formed in order to drive another element outside of the LSI. In addition, since the input/output buffer region must function as an interface as described above, it must receive a signal at a TTL (Transistor-Transistor Logic) level or a CMOS (Complimentary Metal Oxide Semiconductor) level. Thus, in the input/output buffer region, a transistor of special size is formed.

FIG. 1 is a diagram showing a structure of a complimentary MOS semiconductor integrated circuit device constituting a conventional gate array. In FIG. 1, bonding pads 2 are disposed in the periphery of a semiconductor chip 1, and an internal logic gate portion 3 is disposed in the central portion of the semiconductor chip 1. The internal logic gate portion 3 is structured by regularly arranging basic cells each comprising a pair of a P-type MOS transistor and an N-type MOS transistor in an array manner. Input/output buffers 4 are provided between the bonding pads 2 and the internal logic gate portion 3 in such a manner as to surround the internal logic gate portion 3 in order to provide an interface between the internal logic gate portion 3 and the outside of the chip.

FIG. 2 is a diagram showing a detailed structure of each of the input/output buffers 4 and the peripheral portions. In FIG. 2, the input/output buffer 4 is divided into input/output buffer cells 5 the number of which is the same as that of the bonding pads 2, the bonding pads 2 and the input/output buffer cells 5 being in one-to-one correspondence to each other. Each of this input/output buffer cells 5 comprises a P-type MOS transistor region for output (referred to as output P-MOS portion hereinafter) 6, an N-type MOS transistor region for output (referred to as output N-MOS portion hereinafter) 7, a P-type MOS transistor region for input and logic (referred to as input/logic P-MOS portion hereinafter) 8 and an N-type MOS transistor region for input and logic (referred to as input/logic N-MOS portion hereinafter) 9 respectively having inherent sizes corresponding to the driving ability or the like as described above.

P-type region PA and an N-type region NA are disposed in this order in the direction from the bonding pads 2 to the internal logic gate portion 3 (referred to as cell disposing direction hereinafter). In the P-type region PA, the output P-MOS portion 6 and the input/logic P-MOS portion 8 are arranged in the direction in which the bonding pads 2 are arranged (referred to as pad arranging direction hereinafter). On the other hand, in the N-type region NA, the output N-MOS portion 7 and the input/logic N-MOS portion 9 are respectively arranged corresponding to the output P-MOS portion 6 and the input/logic P-MOS portion 8. Until the master process, this input/output buffer cell 5 is structured to be able to select any one of respective roles of an input buffer, an output buffer, a tri-state output buffer and an input/output bidirectional buffer.

First, if and when the input/output buffer cell is used as the input buffer, the input/logic P-MOS portion 8 and the input/logic N-MOS portion 9 are connected to each other, and the other portions 6 and 7 are not used. Then, when the input/output buffer cell 5 is used as the output buffer, the output P-MOS portion 6 and the output N-MOS portion 7 are connected to each other, and the other portions 8 and 9 are not used. When the input/output buffer cell 5 is used as the tri-state output buffer and the input/output bidirectional buffer, respectively, the output P-MOS portion 6 is connected to the output N-MOS portion 7, as well as to the input/logic P-MOS portion 8, and the input/logic N-MOS portion 9 is connected to the output N-MOS portion 7, as well as to the input/logic P-MOS portion 8. Therefore, considering the connecting relation between the regions, the disposition as shown in FIG. 2 is achieved in the input/output buffer cell 5.

The conventional input/output buffer cell 5 is arranged as shown in FIG. 2, so that the size La of the input/output buffer cell 5 in the pad arranging direction is larger than the size Lb of the bonding pad 2 in the pad arranging direction. In addition, in the conventional semiconductor integrated circuit device, one input/output buffer cell 5 is provided corresponding to one bonding pad 2. From the foregoing, the maximum number of input pins which can be provided on one semiconductor chip is determined depending on the size of the input/output buffer cell 5 in the pad arranging direction.

Meanwhile, as miniaturizing techniques progress, integration of internal logic gates has been recently improved. Correspondingly, the number of input/output pins must be increased. However, since the conventional semiconductor integrated circuit device is structured as described above, the number of input/output buffer cells 5 must be increased by the same number in order to increase the number of the input/output pins, from the above described reasons. Thus, considering the size of the conventional input/output buffer cell 5 in the pad arranging direction, the number of the input/output buffer cells 5 which can be disposed on one semiconductor chip 1 has a limit. In addition, if the number of the input/output buffer cells 5 is increased beyond the limit, the chip size of the semiconductor chip 1 is significantly increased.

Additionally, since transistors for output in the conventional input/output buffer cell 5 are respectively formed in fixed sizes, only a limited given constant driving ability can be obtained. If a combination of basic cells in the internal logic gate portion is changed, the sizes of the transistors in the input/output buffer cell 5 must be correspondingly changed to provide sufficient driving capacity.

Additionally, since transistors for input in the conventional input/output buffer cell 5 are respectively formed in fixed sizes, only an interface at a constant level can be obtained.

SUMMARY OF THE INVENTION

An object of the present invention is to provide a semiconductor integrated circuit device having a lot of input/output pins while restraining the increase in chip size without degrading the performance of an input/output buffer.

Another object of the present invention is to provide a semiconductor integrated circuit device capable of performing a variety of output driving functions.

Still another object of the present invention is to provide a semiconductor integrated circuit device capable of providing a variety of input interfaces.

Briefly stated, the present invention is directed to a semiconductor integrated circuit device comprising an internal logic gate portion provided in the central portion of a semiconductor chip, an input/output buffer in which a plurality of input/output buffer cells are provided to surround the internal logic gate portion, and a plurality of bonding pads respectively provided in the peripheral portions of the semiconductor chip corresponding to the plurality of input/output buffer cells, each of the input/output buffer cells comprising a transistor region for output of a first conductivity type, a transistor region for output of a second conductivity type, a transistor region for input and logic of the first conductivity type and a transistor region for input and logic of the second conductivity type, the regions being disposed in a single line in the above described cell disposing direction.

In accordance with another aspect of the present invention, a plurality of transistors in a transistor region for output of a first conductivity type and a plurality of transistors in the transistor region for output of a second conductivity type are regularly arranged in the above described cell disposing direction or the above described pad arranging direction with the transistors being paired with each other.

In accordance with still another aspect of the present invention, a plurality of transistors in a transistor region for input and logic of a first conductivity type and a plurality of transistors in a transistor region for input and logic of a second conductivity type are regularly arranged in the above described pad arranging direction with the transistors being paired with each other.

According to the present invention, since each of the input/output buffer cells comprises the transistor region for output of the first conductivity type, the transistor region for output of the second conductivity type, the transistor region for input and logic of the first conductivity type, and the transistor region for input and logic of the second conductivity type, the regions being disposed in the above described cell disposing direction, so that the size of the input/output buffer cell in the above described pad arranging direction is decreased, so that a lot of bonding pads can be provided. In addition, since a region for output is structured by arranging a plurality of basic cells each comprising a pair of a transistor of the first conductivity type and a transistor of the second conductivity type, an output buffer having desired driving ability can be structured by changing a mask pattern used in a slice process. Furthermore, since a transistor region for input and logic is structured by arranging a plurality of basic cells each comprising a pair of the transistors of the first conductivity type and the transistors of the second conductivity type, an input buffer at a desired input level and a buffer having various logic circuits can be structured by changing a mask pattern in the slice process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring now to FIGS. 3 to 6, description is made on a structure of a semiconductor integrated circuit device according to one embodiment of the present invention.

Figure 1:
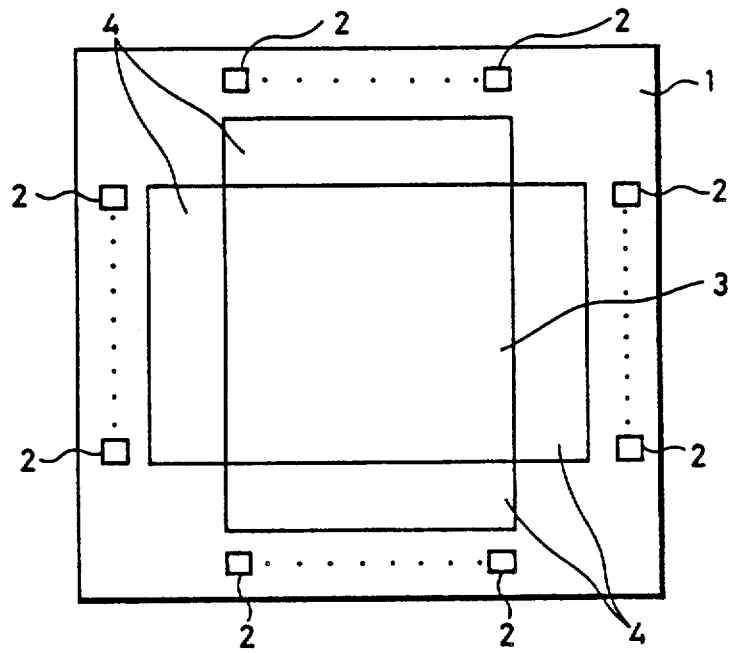
FIG. 1 is a diagram showing a structure of a semiconductor integrated circuit device constituting a gate array which is a background of the present invention.
Figure 2:
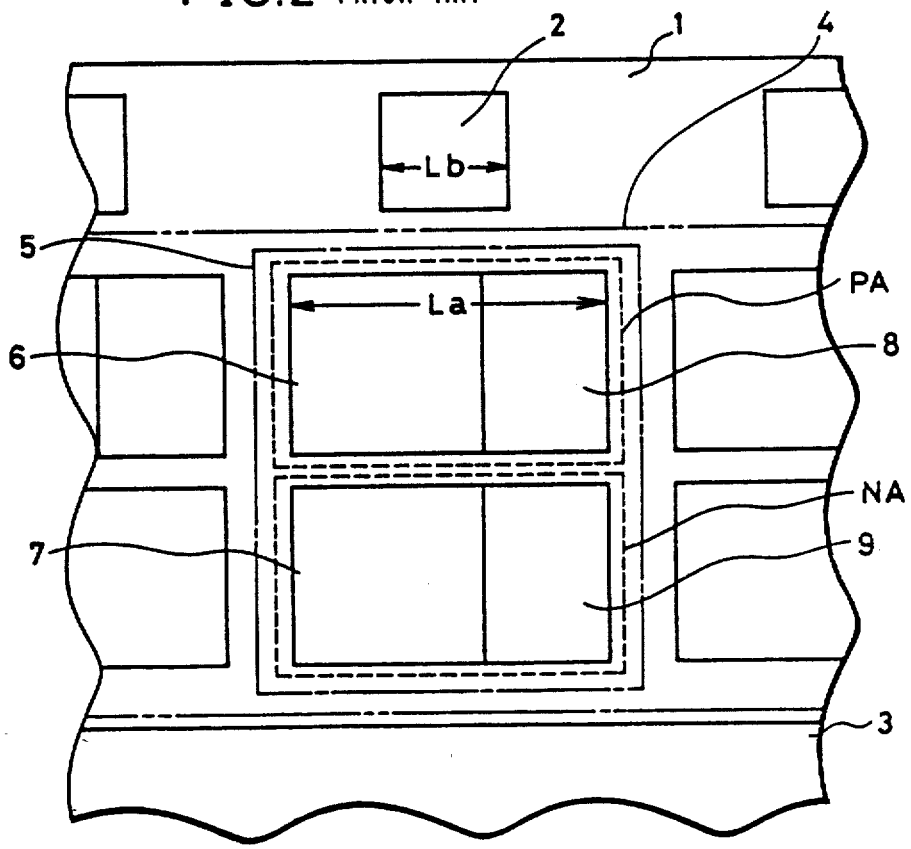
FIG. 2 is a diagram showing a detailed structure of an input/output buffer and the peripheral portions shown in FIG. 1.
Figure 3:
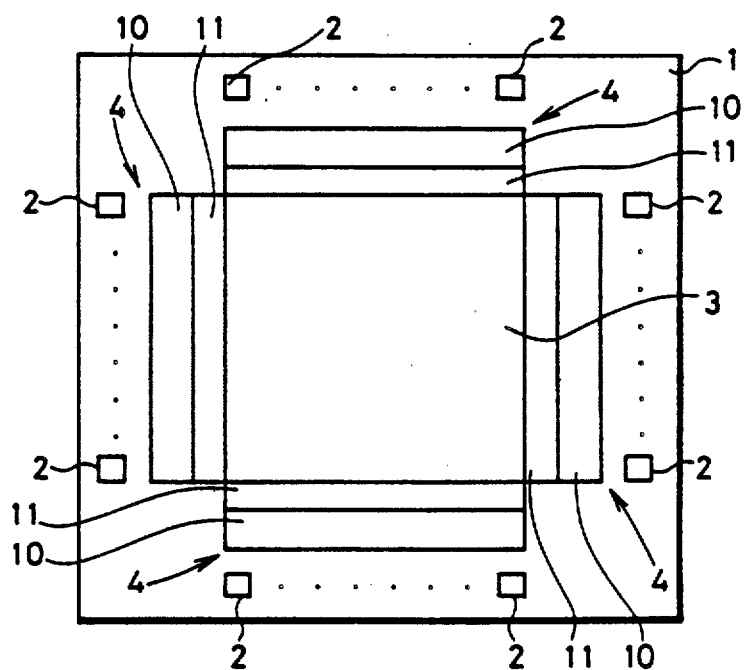
FIG. 3 is a diagram showing the entire structure of a semiconductor integrated circuit device according to one embodiment of the present invention.
Figure 4:
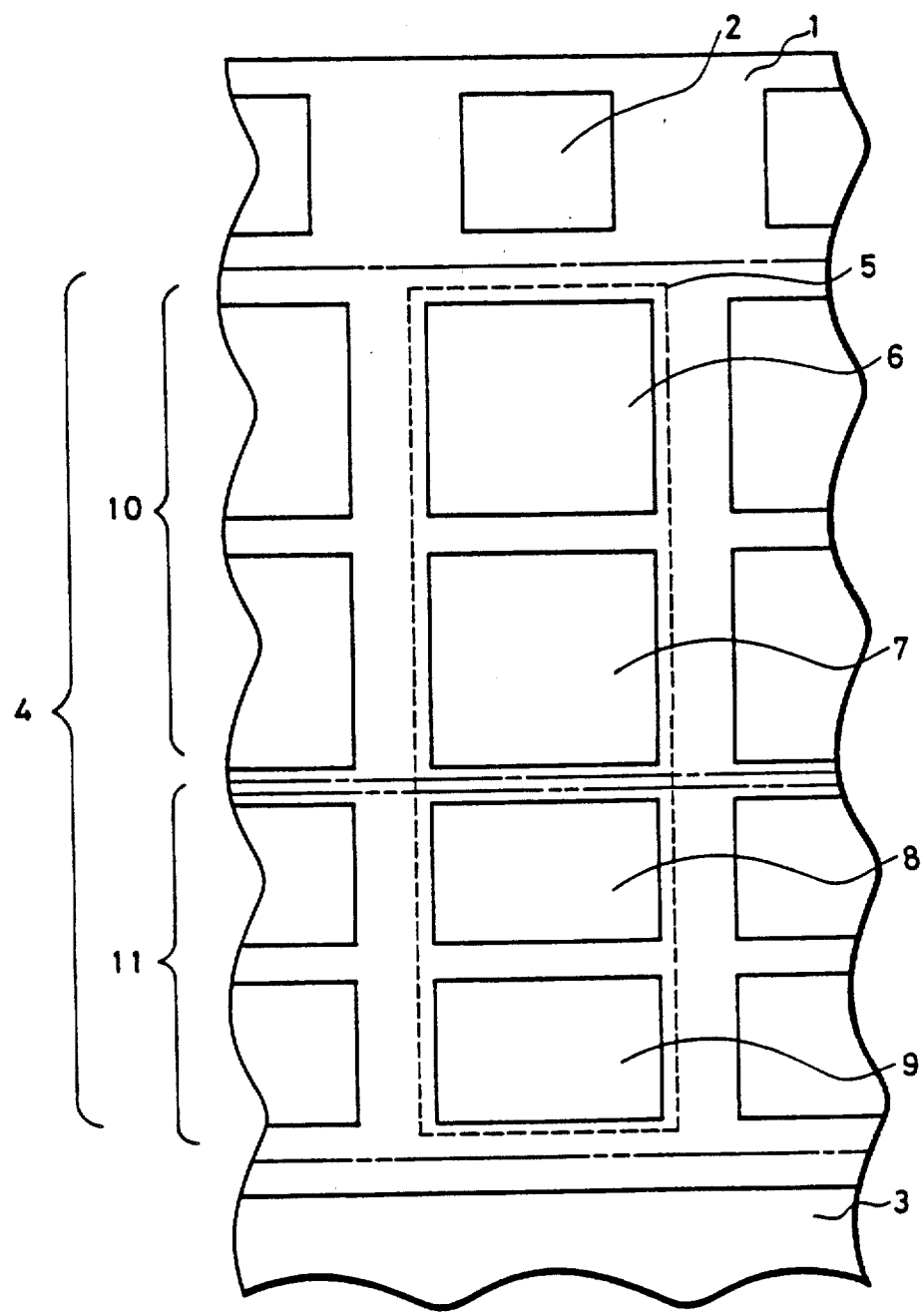
FIG. 4 is a diagram showing a detailed structure of an input/output buffer and the peripheral portions shown in FIG. 3.
Figure 5:
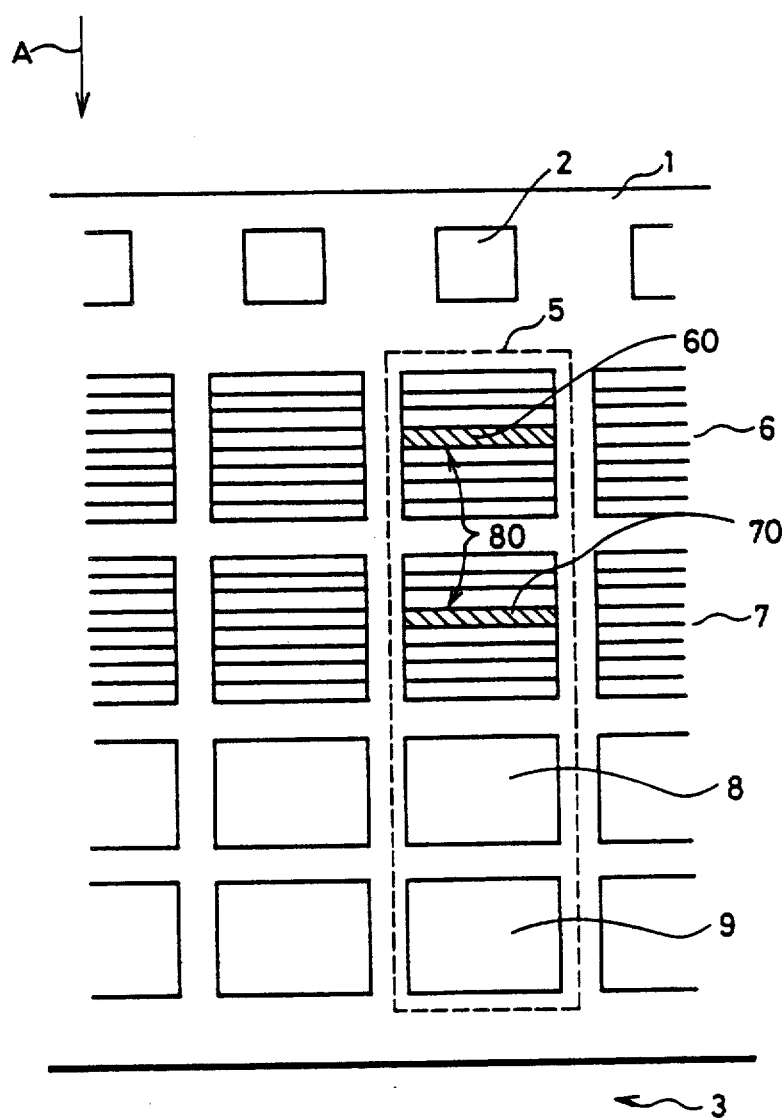
FIG. 5 is a diagram showing a structure of a region for output shown in FIG. 4.

Input/output buffers region 4 having input/output buffer cells 5 between bonding pads 2 and an internal logic gate port comprises a region 10 for output and a region 11 for input/logic. The region 10 for output comprises an output P-MOS portion 6 and an output N-MOS portion 7, and the region 11 for input/logic comprises an input/logic P-MOS portion 8 and an input/logic N-MOS portion 9 as shown in FIGS. 3 and 4. As shown in FIG. 5, the output N-MOS portion 6, the output P-MOS portion 7, the input/logic N-MOS portion 8 and the input/logic P-MOS portion 9 are disposed in this order in the cell disposing direction represented by an arrow A. In the output P-MOS portion 6, a plurality of, for example, eight P-type cells 60 for output are regularly disposed in the cell disposing direction. In the output N-MOS portion 7, a plurality of, for example, eight N-type cells 70 for output are regularly disposed in the cell disposing direction. The P-type cells 60 for output and the N-type cells 70 for output are in one-to-one correspondence to each other in the order of the arrangement, one of the P-type cells 60 for output and the corresponding N-type cell 70 for output constituting a single basic cell 80.

Additionally, in a semiconductor chip 1, oxide films are provided in respective regions between the bonding pad 2 and the output P-MOS portion 6, between the output P-MOS portion 6 and the output N-MOS portion 7, between the output N-MOS portion 7 and the input/logic P-MOS portion 8 between the input/logic P-MOS portion 8 and the input/logic N-MOS portion 9, and between the input/logic N-MOS portion 9 and the internal logic gate portion 3, to isolate the regions.

Figure 6:
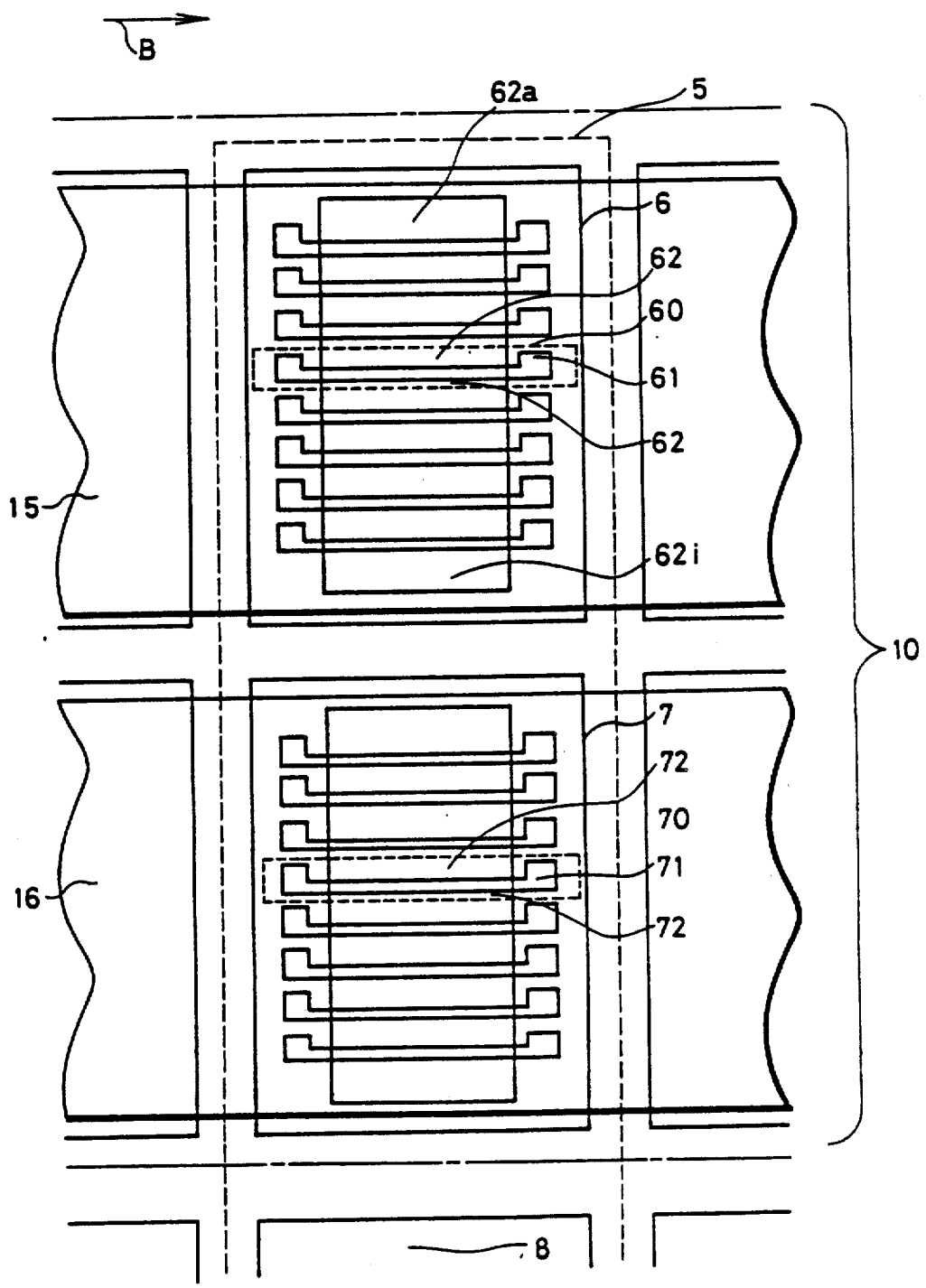
FIG. 6 is an enlarged view of the region for output shown in FIG. 5.

As shown in FIG. 6, a P-type cell 60 for output comprises a gate electrode 61 and source/drain regions 62 which are a P-type impurity diffused region. Source/drain regions other than source/drain regions 62a and 62i in both ends of the output P-MOS portion 6 are shared between adjacent two P-type cells for output. Similarly to the P-type cell 60 for output, the N-type cell 70 for output comprises a gate electrode 71 and source/drain regions 72 which are an N-type impurity diffused region. A power-supply line 15 is provided on the output P-MOS portion 6 along the pad arranging direction represented by an arrow B, and a ground line 16 is provided on the output N-MOS portion 7 along the pad arranging direction.

Figure 7A:
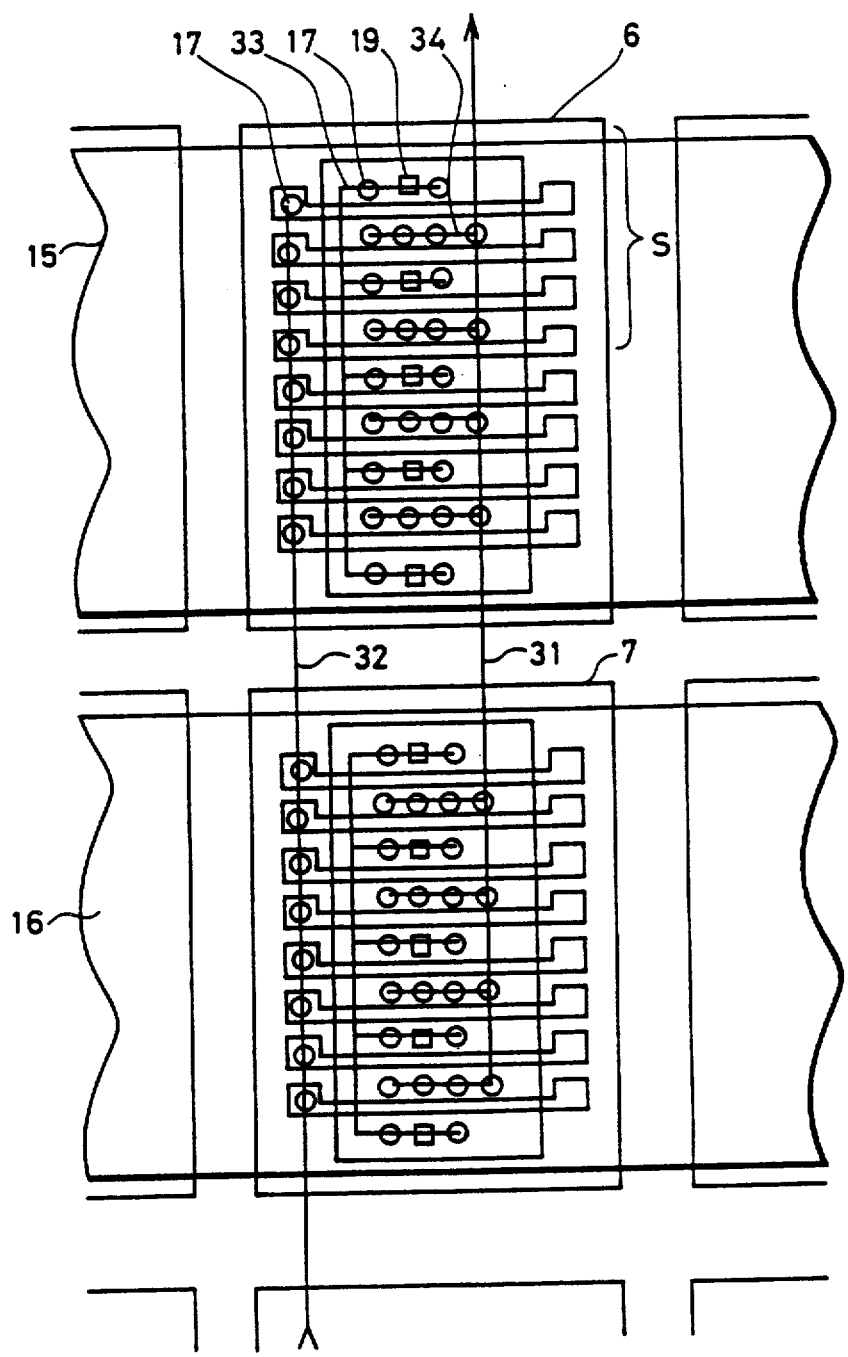
FIGS. 7A, 8A, and 9A are diagrams showing an example of an output buffer using basic cells in the region for output shown in FIG. 6.
Figure 7B:
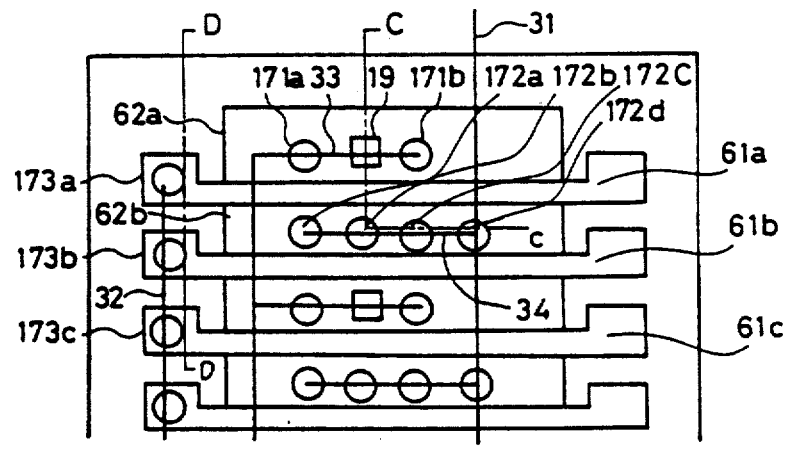
FIG. 7B is an enlarged view of a region S shown in FIG. 7A.
Figure 7C:
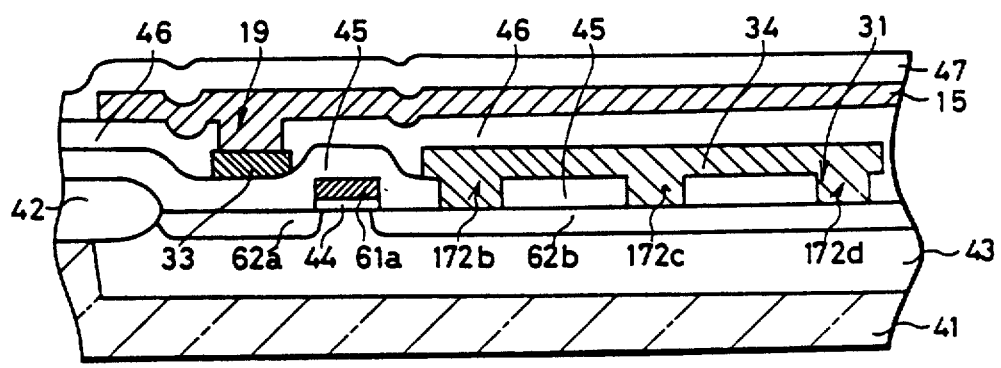
FIG. 7C is a cross sectional end view taken along a line C—C shown in FIG. 7B.
Figure 7D:
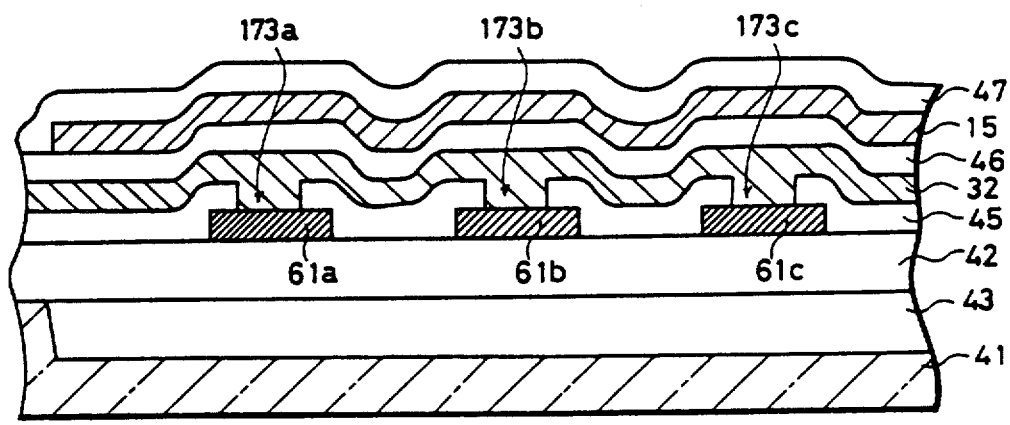
FIG. 7D is a cross sectional view taken along a line D—D shown in FIG. 7D.

If an output buffer is structured, it is necessary to provide, for example, a contact hole 17 represented by a circle mark in FIG. 7A, a through hole 19 represented by a square mark, interconnections 31, 32, 33 and 34. Referring now to FIGS. 7A to 7D, description is made on a structure of the output P-MOS portion 6. A semiconductor substrate 41 of, for example, a P-type is used as a substrate. Oxide films for isolation are formed on the surface of the substrate 41. An oxide film 42 shown in FIG. 7C is between a bonding pad 2 and an output P-MOS portion 6. An N-type well 43 is formed on the surface of the semiconductor substrate between the oxide film between the bonding pad 2 and the output P-MOS portion 6 and the oxide film between the output P-MOS portion 6 and an output N-MOS portion 7. Gate insulating films 44 and gate electrodes 61a–c are formed on the well 43 at predetermined intervals. P-type source/drain regions 62 are formed in the surface of the well 43 between the oxide film 42 and the gate electrodes 61 and between the gate electrodes. The source/drain region 62a is electrically connected to the interconnection 33 on contact holes 171a and 171b, the interconnection 33 being connected to the power-supply line 15 through the through hole 19. In addition, the source/drain region 62b is electrically connected to the interconnection 34 on contact holes 172a, 172b, 172c and 172d. The interconnection 34 is connected to the interconnection 31 extending in the cell disposing direction on the contact hole 172d. Numerals 45, 46 and 47 in FIG. 7C denote insulating films. As shown in FIG. 7D, the gate electrodes 61a, 61b and 61c are electrically connected to the interconnection 32 extending in the cell disposing direction on contact holes 173a, 173b and 173c, respectively. In the output P-MOS portion 6 shown in FIG. 7A, respective interconnection patterns of the source/drain regions 62a and 62b are alternately formed.

Figure 7E:
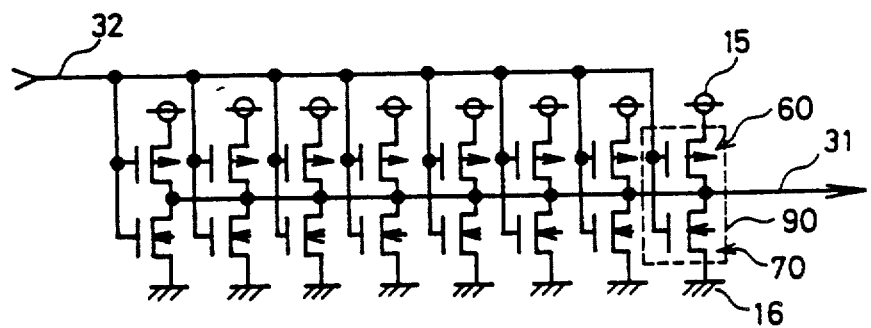
FIGS. 7E, 8B and 9B are diagrams showing an equivalent circuit of the output buffer shown in FIGS. 7A, 8A and 9A.

An output N-MOS portion 7 has the same structure as that of the output P-MOS portion 6 except that the well 43 is not formed, a source/drain region is of an N type, and the power-supply line 15 is replaced with a ground line 16 as shown in FIG. 7E, and hence, the description thereof is omitted. An output buffer formed by providing interconnections shown in FIG. 7A comprises eight inverter circuits 90 each comprising a P-type cell 60 for output and an N-type cell 70 for output connected in parallel.

Figure 8A:
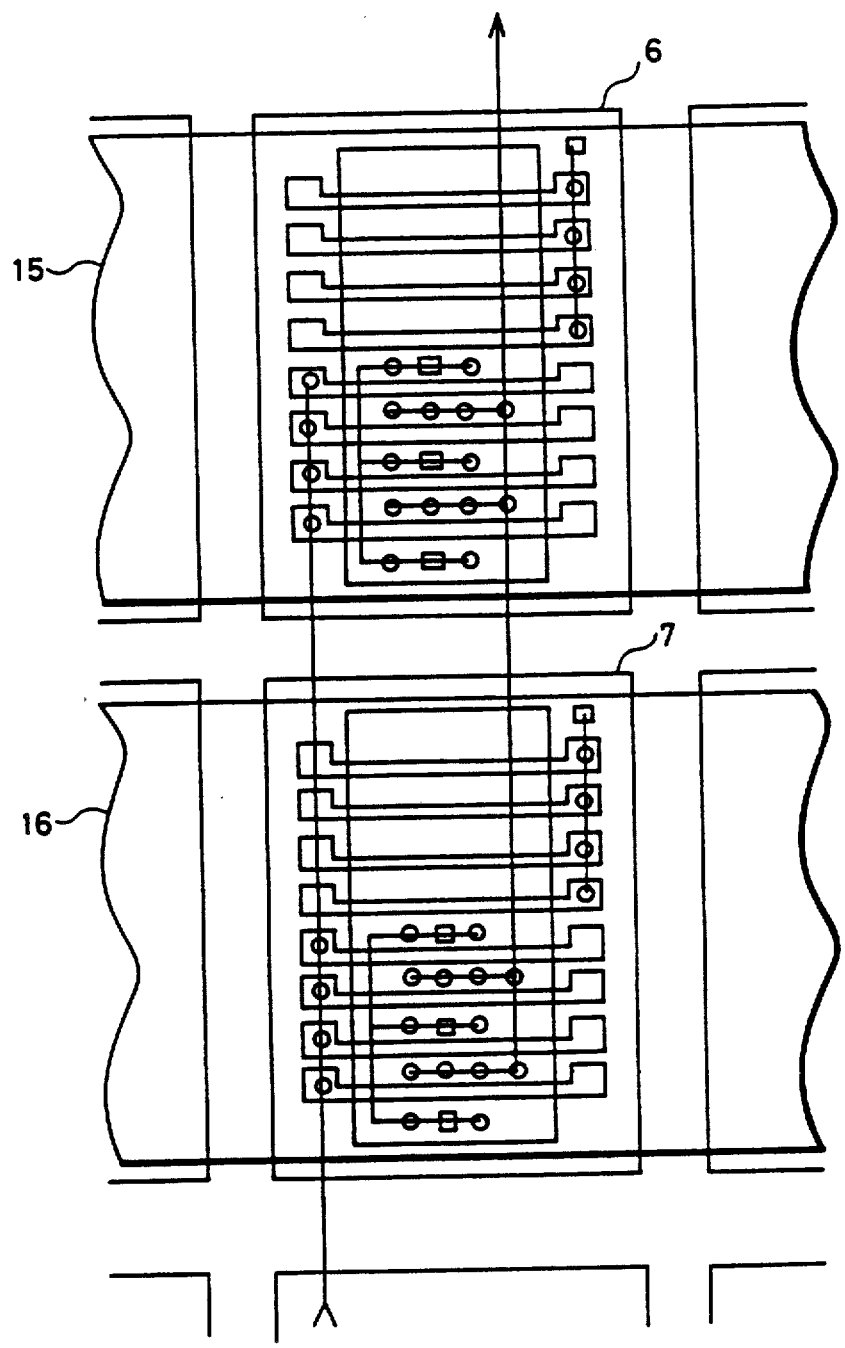
Figure 9A:
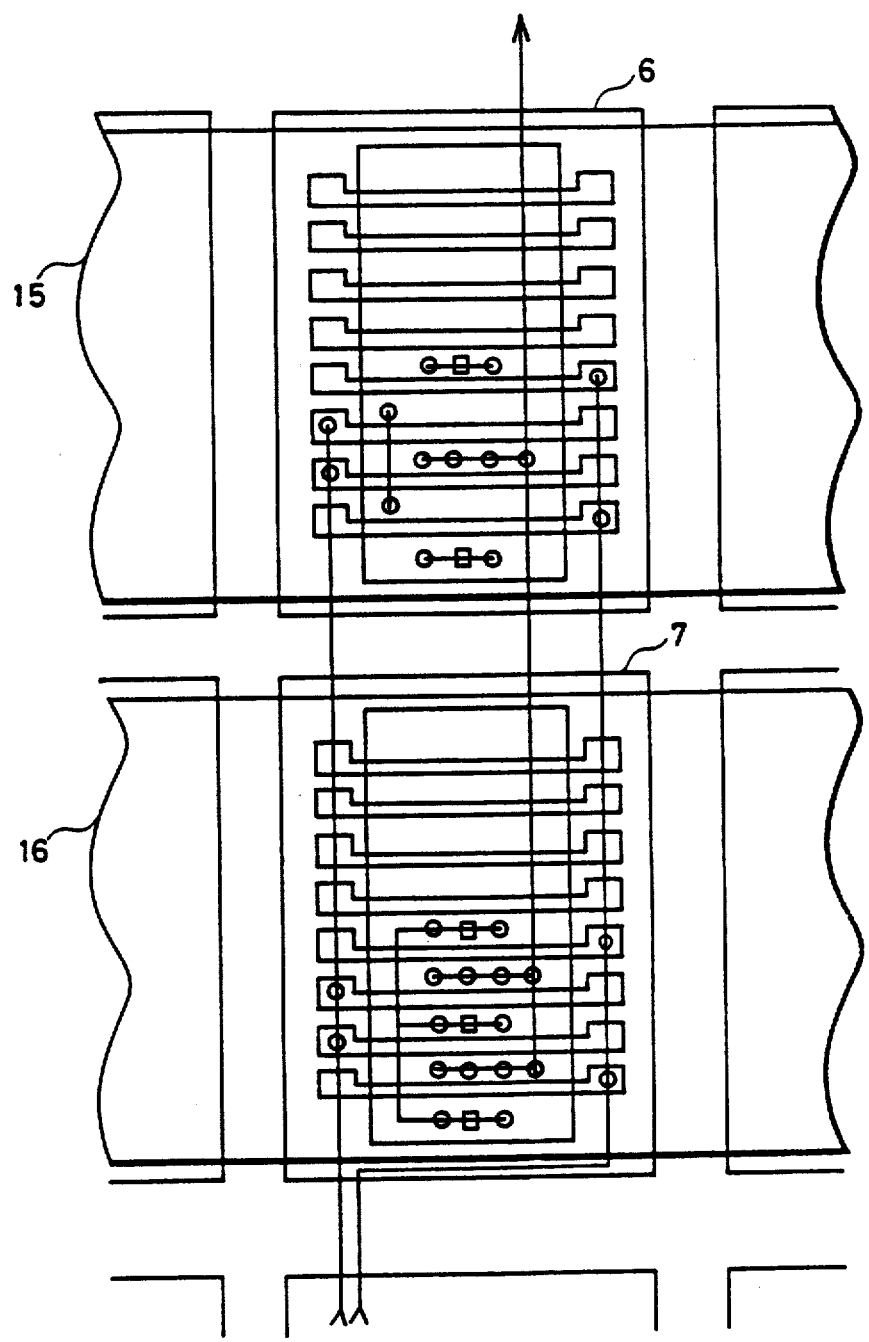
Figure 8B:
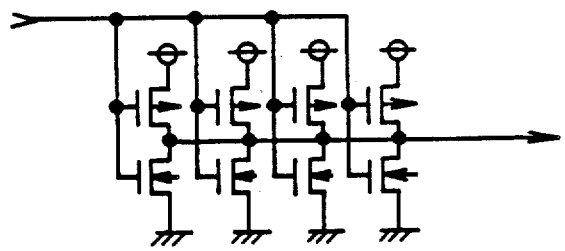
Figure 9B:
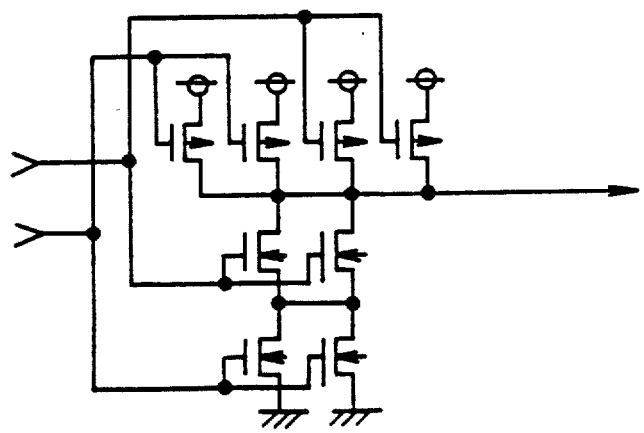

If the driving ability may be approximately one-half of that of the output buffer shown in FIG. 7A, it is necessary to structure a circuit as shown in FIGS. 8A and 8B using the half of basic cells in the region 10 for output. In addition, when a logic /output buffer such as a 2-input NAND gate is to be formed, it is necessary to form interconnections as shown in FIG. 9A, to structure a circuit shown in FIG. 9B.

Figure 10:
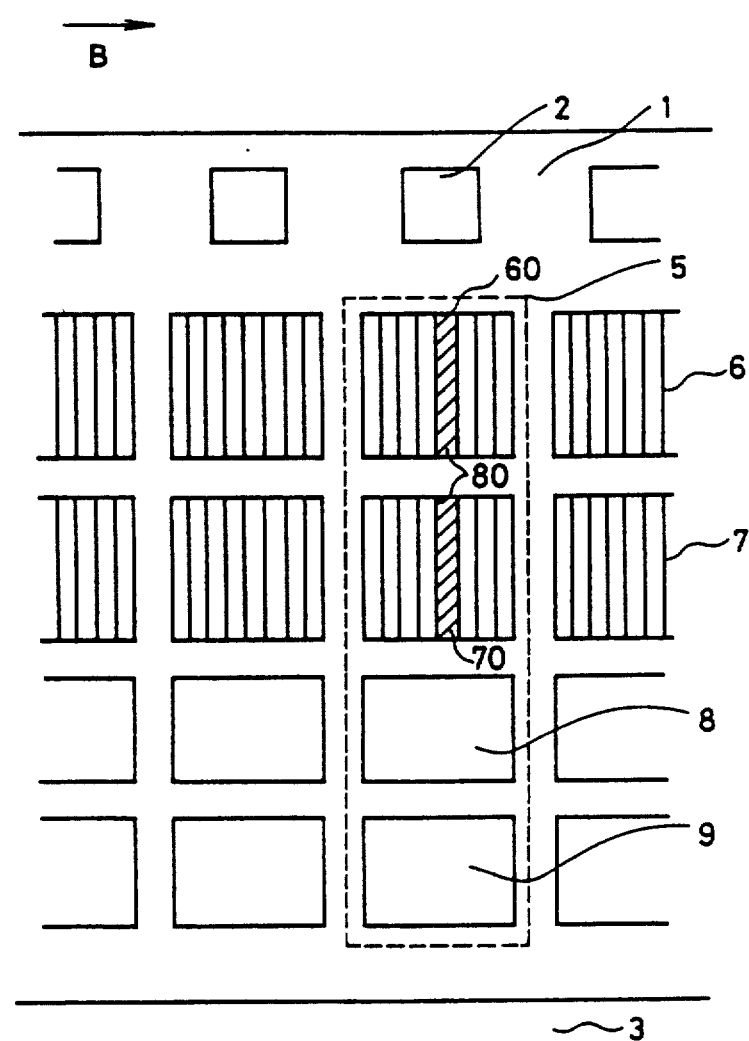
FIG. 10 is a diagram showing a structure of an input/output buffer provided with basic cells having a different arrangement from that of the basic cells shown in FIG. 5.

Although in the above described embodiment, the P-type cell 60 for output and the N-type cell 70 for output are disposed in the direction from the bonding pad 2 to the internal logic gate portion 3, the P-type cell 60 for output and the N-type cell 70 for output may be arranged in the pad arranging direction represented by the arrow B shown in FIG. 10 and to be opposed to each other.

Since the distance between the P-type cell 60 for output and the N-type cell 70 for output corresponding thereto becomes shorter than that shown in FIG. 5, input capacitance is decreased. In addition, when the P-type cell 60 for output and the N-type cell 70 for output are disposed as shown in FIG. 5, the interconnection 31 towards the bonding pad 2 crosses the above described cells as shown in FIG. 7A, so does the interconnection 34 for making contact with the source/drain region. On the other hand, when the cells are arranged as shown in FIG. 10, the interconnection 31 vertically crosses the cells, so that contact with the source/drain region is easily made. Thus, the number of contact holes can be increased, so that the reading speed of charges can be improved.

Figure 11:
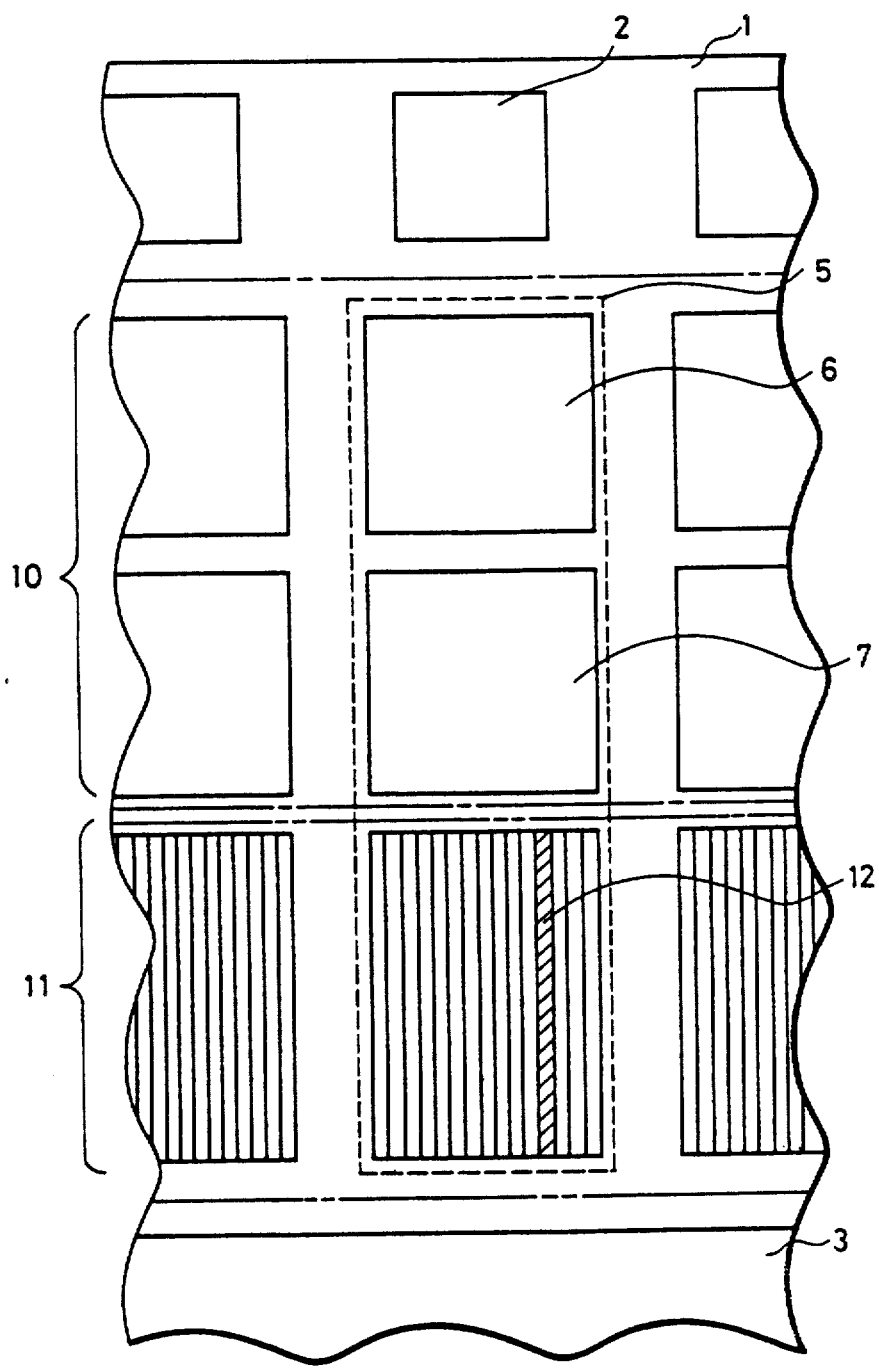
FIG. 11 is a diagram showing a structure of a region for input/logic according to another embodiment of the present invention.

Description is now made on another embodiment of the present invention in which a gate array is applied to the region 11 for input/logic. As shown in FIG. 11, an output P-MOS portion 6, an output N-MOS portion 7 and a basic cell 12 for input/logic are disposed in the cell disposing direction. In addition, as in the above described embodiment, on a semiconductor chip 1, oxide films are provided in respective regions between a bonding pad 2 and an output P-MOS portion 6, between the output P-MOS portion 6 and an output N-MOS portion 7, between the output N-MOS portion 7 and a basic cell 12 for input/logic, and between the basic cell 12 for input/logic and an internal logic gate portion 3, to isolate the regions.

Figure 12:
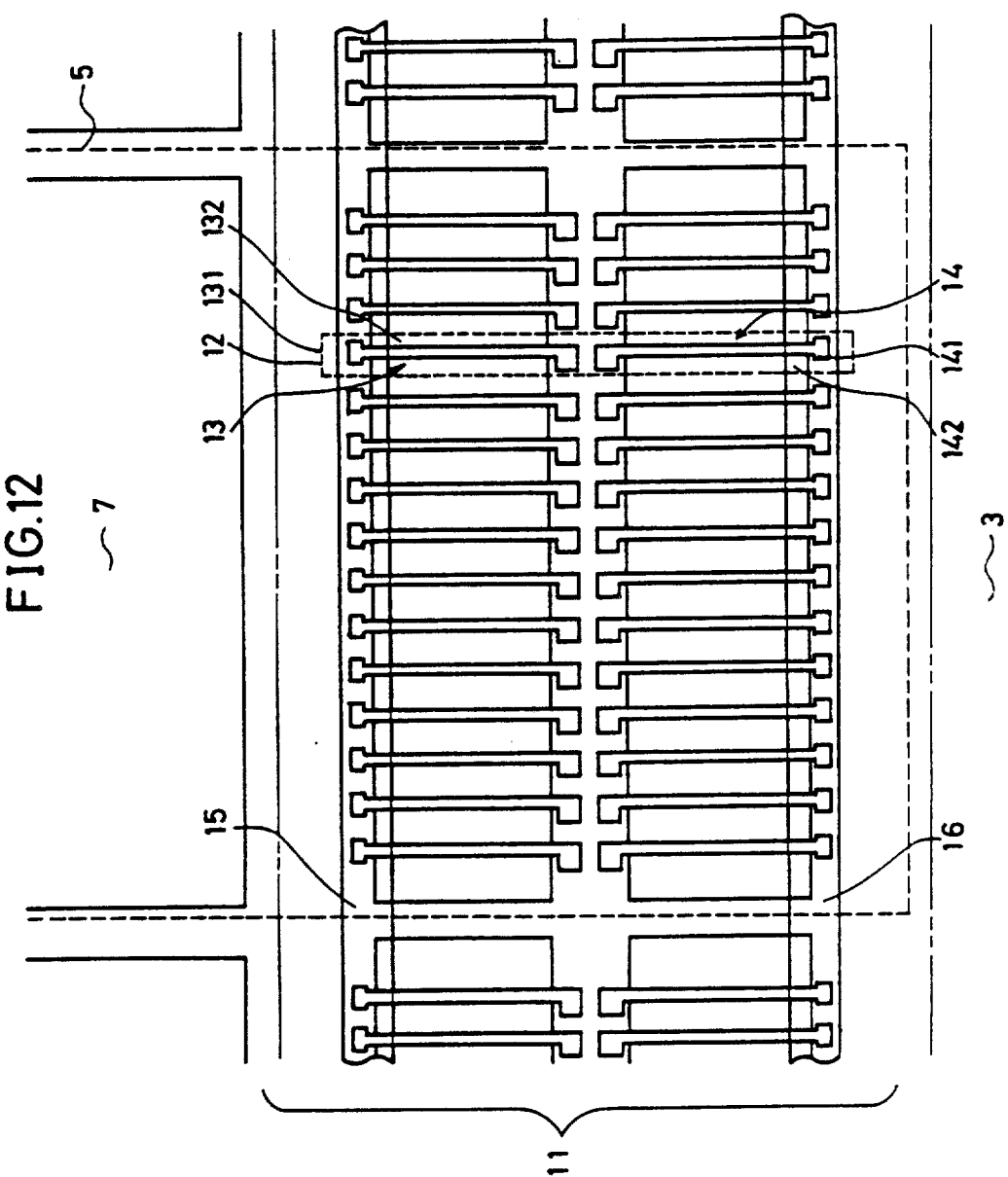
FIG. 12 is a diagram showing a structure of the region for input/logic shown in FIG. 11.

As shown in FIG. 12, a basic cell 12 for input/logic comprises a pair having a P-MOS 13 for input/logic and an N-MOS 14 for input/logic. The P-MOS 13 for input/logic comprises a gate electrode 131 and gate/drain regions 132 which are a P-type impurity diffused region, and the N-MOS 14 for input/logic comprises a gate electrode 141 and gate/drain regions 142 which are an N-type impurity diffused region. The basic cells 12 are regularly arranged in the pad arranging direction between an output N-MOS portion 7 and an internal logic gate portion 3. A power-supply line 15 and a ground line 16 respectively pass on the P-MOS 13 for input/logic and the N-MOS 14 for input/logic along the pad arranging direction.

Figure 13A:
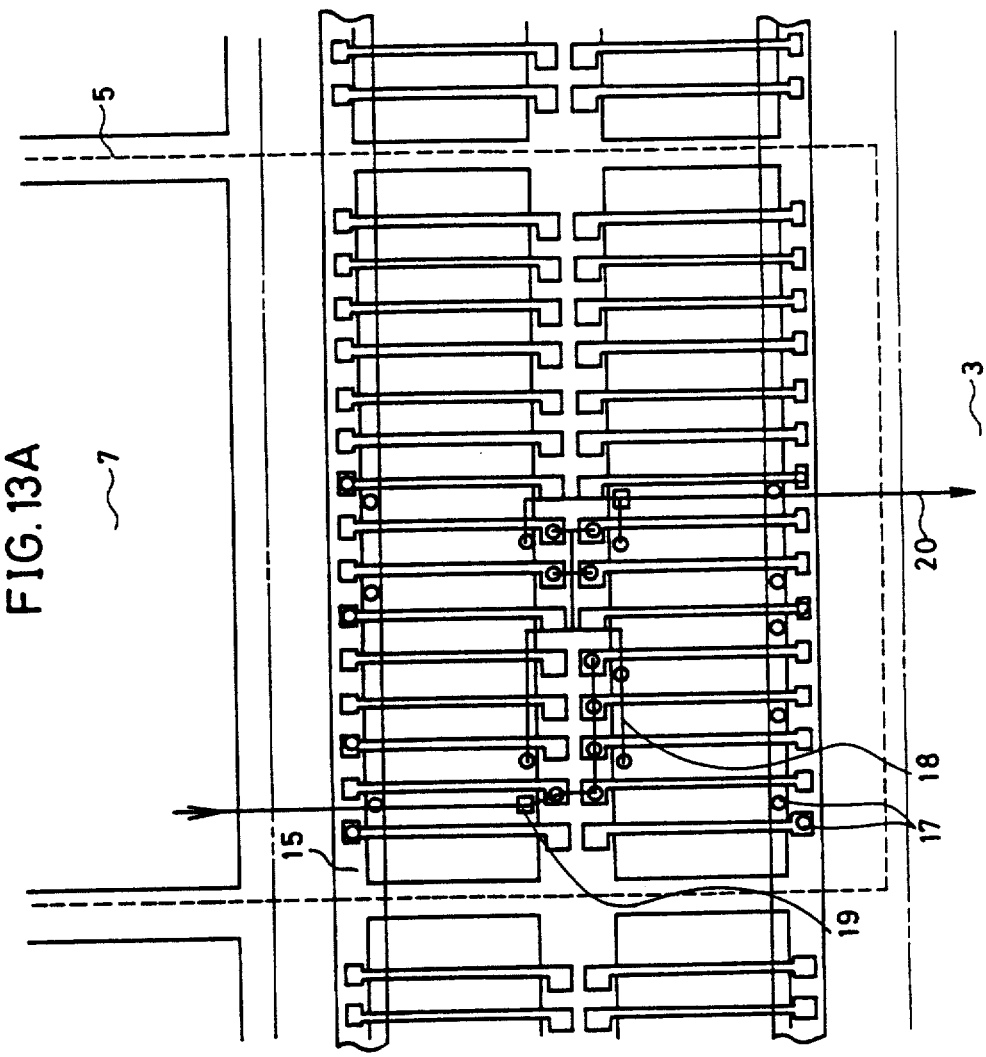
FIG. 13A is a diagram showing one example of an input buffer using basic cells in the region for input/logic shown in FIG. 12.
Figure 13B:
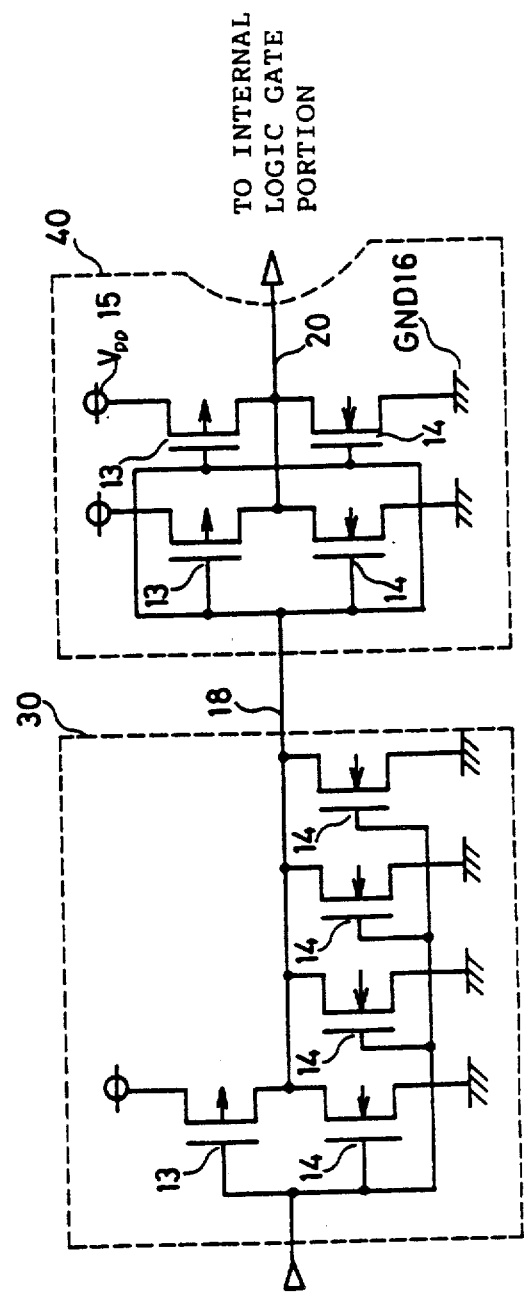
FIG. 13B is a diagram showing an equivalent circuit of the input buffer shown in FIG. 13A.

If an input buffer circuit is structured, it is necessary to provide a contact hole 17, a first aluminum interconnection layer 18, a through hole 19 and a second aluminum interconnection layer 20, as shown in, for example, FIG. 13A. Thus, an input buffer as shown in FIG. 13B is structured. In FIG. 13B, a circuit portion 30 in the input buffer is an inverter comprising a single P-MOS 13 and four N-MOSs 14 connected in parallel, which provides a TTL level interface. A circuit portion 40 is an inverter comprising two P-MOSs 13 connected in parallel and two N-MOSs 14 connected in parallel, which drives an internal gate.

Figure 14:
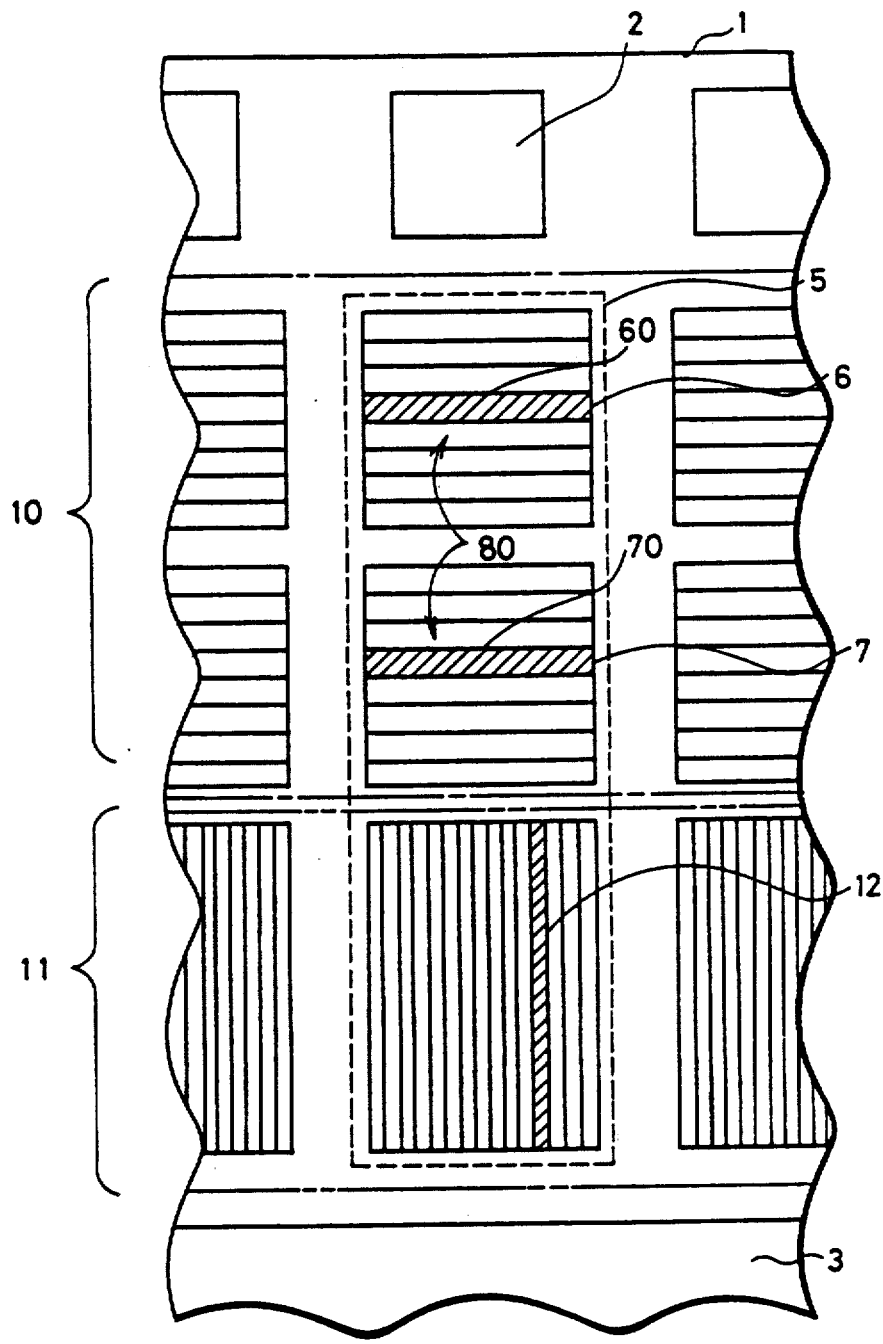
FIG. 14 is a diagram showing a structure of an input/output buffer according to still another embodiment of the present invention.

FIG. 14 is a diagram showing still another embodiment of the present invention in which a gate array is applied to both a region 10 for output and a region 11 for input/logic. In FIG. 14, an output buffer is structured using basic cells 80 each comprising a P-type cell 60 for output in an output P-MOS portion 6 and an N-type cell 70 for output in an output N-MOS portion 7, and an input buffer having a logic circuit is structured using a basic cell 12 in the region 11 for input/logic.

Figure 15:
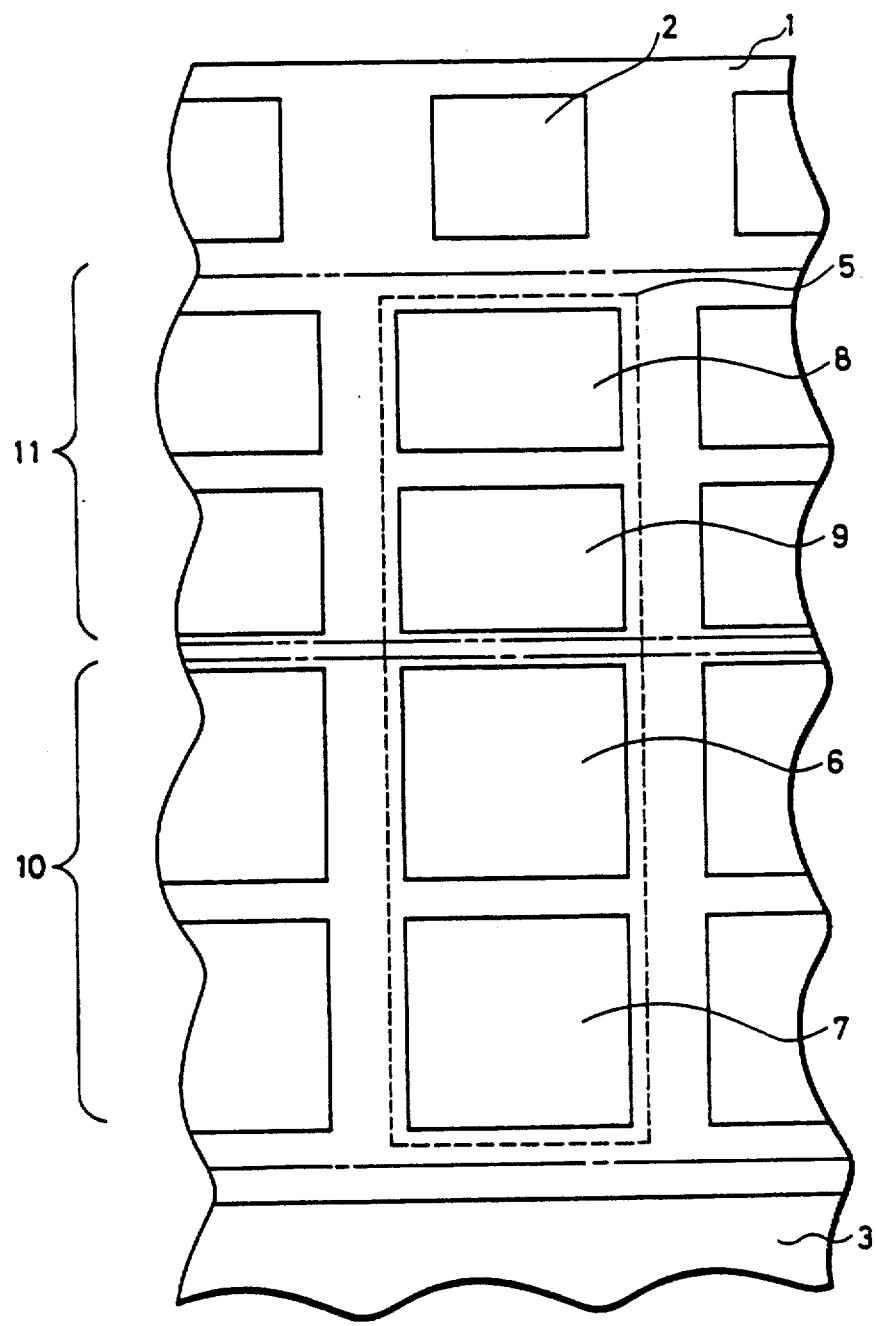
FIG. 15 is a diagram for explaining a modified example of an arrangement of a plurality of transistor regions in the input/output buffer.

Although in the above described embodiment, description was made on a case in which the region 11 for input/logic is provided in the periphery of the internal logic gate 3, the region 10 for output is provided in the periphery thereof, and the bonding pad 2 is provided in the periphery thereof, the region 10 for output may be provided in the periphery of the internal logic gate 3, the region 11 for input/logic may be provided in the periphery thereof, and the bonding pad 2 may be provided in the periphery thereof, as shown in FIG. 15. In addition, in each of the input/output buffers shown in FIGS. 4 and 15, the output P-MOS portion 6 and the output N-MOS portion 7 may be arranged with the portions being replaced with each other. Furthermore, an input/logic P-MOS portion 8 and an input/logic N-MOS portion 9 may be arranged with the portions being replaced with each other.

If and when the input/output buffer cell 5 structured as described above is employed as an input buffer as in the conventional example, the input/logic P-MOS portion 8 and the input/logic N-MOS portion 9 are connected to each other. On the other hand, when the input/output buffer cell 5 is employed as an output buffer, the output P-MOS portion 6 and the output N-MOS portion 7 are connected to each other. Furthermore, when the input/output buffer cell 5 is employed as a tri-state output buffer and an input/output bidirectional buffer, the output P-MOS portion 6 is connected to the output N-MOS portion 7 as well as to the input/logic P-MOS portion 8, and the input/logic N-MOS portion 9 is connected to the output N-MOS portion 7 as well as to the input/logic P-MOS portion 8.

In the above described structure, the size of the input/output buffer cell 5 in the pad arranging direction is decreased, as compared with that in the conventional example, so that the number of bonding pads 2 can be increased by the decreased size, whereby the increase in chip size with the increase in the number of input/output pins can be restrained.

Additionally, a metal interconnection is formed by changing a mask pattern used in the slice process, so that there can be structured an output buffer having desired driving ability and/or an input buffer at a desired input level and a buffer having various logic circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   an internal logic gate portion provided in the central portion of a semiconductor chip;
   an input/output buffer in which a plurality of input/output buffer cells are provided to surround said internal logic gate portion; and
   a plurality of bonding pads respectively provided in the peripheral portions of said semiconductor chip corresponding to said plurality of input/output buffer cells;
   each of said input/output buffer cells comprising first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a single line in a direction from said bonding pads to said internal logic gate portion, wherein said transistor regions for output are positioned adjacent each other and said transistor regions for input and logic are positioned adjacent each other.

2. The semiconductor integrated circuit device according to claim 1, wherein
   said first through fourth transistor regions being located in first through fourth positions, respectively, and disposed in a numerically sequential order, beginning with the first position, in a single line in a direction from said bonding pads to said internal logic gate portion.

3. The semiconductor integrated circuit device according to claim 2, wherein
said first transistor region of the first conductivity type for output and said second transistor region of the second conductivity type for output are disposed in the second and first positions, respectively.

4. The semiconductor integrated circuit device according to claim 3, wherein
said third transistor region of the first conductivity type for input and logic and said fourth transistor region of the second conductivity type for input and logic are disposed in the fourth and third positions, respectively.

5. The semiconductor integrated circuit device according to claim 2, wherein
said third transistor region of the first conductivity type for input and logic and the fourth transistor region of the second conductivity type for input and logic are disposed in the fourth and third positions, respectively.

6. The semiconductor integrated circuit device according to claim 1, wherein
said said third, fourth, first and second transistor regions being located in first through fourth positions respectively and disposed in a numerically sequential order, beginning with the first position, in a single line in the direction from said bonding pads to said internal logic gate portion.

7. The semiconductor integrated circuit device according to claim 6, wherein
said third transistor region of the first conductivity type for input and logic and said fourth transistor region of the second conductivity type for input and logic are disposed in the second and first positions, respectively.

8. The semiconductor integrated circuit device according to claim 7, wherein said first transistor region of the first conductivity type for output and said second transistor region of the second conductivity type for output are disposed in the fourth and third positions respectively.

9. The semiconductor integrated circuit device according to claim 6, wherein
said first transistor region of the first conductivity type for output and said second transistor region of the second conductivity type for output are disposed in the fourth and third positions, respectively.

10. A semiconductor integrated circuit device comprising:
an internal logic gate portion provided in that central portion of a semiconductor chip;
an input/output buffer in which a plurality of input/output buffer cells are provided to surround said internal logic gate portion; and
a plurality of bonding pads respectively provided in the peripheral portions of said semiconductor chip corresponding to said plurality of input/output buffer cells;
each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a first direction from said bonding pads to said internal logic gate portion;
a plurality of transistors in said first transistor region of the first conductivity type for output and a plurality of transistors in said second transistor region of the second conductivity type for output being regularly and sequentially disposed in said first direction with respective transistors of said first conductivity type being paired with respective transistors of said second conductivity type to form functional output buffers, said transistor regions for output being positioned adjacent each other and said transistor regions for input and logic being positioned adjacent each other.

11. The semiconductor integrated circuit device according to claim 10, wherein
each of transistors formed in said first transistor region of the first conductivity type for output and said second transistor region of the second conductivity type for output has the same shape on said semiconductor chip.

12. The semiconductor integrated circuit device according to claim 10, wherein
a plurality of transistors formed in said first transistor region of the first conductivity type for output and said second transistor region of the second conductivity type for output are operatively connected to each other through metal interconnections.

13. A semiconductor integrated circuit device comprising:
an internal logic gate portion provided in the central portion of a semiconductor chip;
an input/output buffer in which a plurality of input/output buffer cells are provided to surround said internal logic gate portion; and
a plurality of bonding pads respectively provided in the peripheral portions of said semiconductor chip corresponding to said plurality of input/output buffer cells;
each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a first direction from said bonding pads to said internal logic gate portion;
a plurality of transistors in said first transistor region of the first conductivity type for output and a plurality of transistors in said second transistor region of the second conductivity type for output being regularly and sequentially disposed in a second direction perpendicularly intersecting said first direction with the individual transistors of said first conductivity type being paired with individual transistors of said second conductivity type to form functional output buffers; said transistor regions for output being positioned adjacent each other and said transistor regions for input and log being positioned adjacent each other.

14. A semiconductor integrated circuit device comprising:
an internal logic gate portion provided in the central portion of a semiconductor chip;

an input/output buffer in which a plurality of input-/output buffer cells are provided to surround said internal logic gate portion; and a plurality of bonding pads respectively provided in the peripheral portions of said semiconductor chip corresponding to said plurality of input/output buffer cells;

each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a first direction from said bonding pads to said internal logic gate portion;

a plurality of transistors in said third transistor region of the first conductivity type for input and logic and a plurality of transistor in said fourth transistor region of the second conductivity type for input and logic being regularly and sequentially arranged in a second direction perpendicularly intersecting said first direction with respective transistors of said first conductivity type being paired with respective transistors of said second conductivity type to form functional input/logic buffers; said transistor regions for output being positioned adjacent each other and said transistor regions for input and logic being positioned adjacent each other.

15. The semiconductor integrated circuit device according to claim 14, wherein
each of the transistors in said third transistor region for of the first conductivity type for input and logic and said fourth transistor region of the second conductivity type for input and logic has the same shape on said semiconductor chip.

16. The semiconductor integrated circuit device according to claim 14, wherein
a plurality of the transistors formed in said third transistor region of the first conductivity type for input and logic and said fourth transistor region of the second conductivity type for input and logic are operatively connected to each other through metal interconnections.

17. A semiconductor integrated circuit device comprising:
an internal logic gate portion provided in the central portion of a semiconductor chip;
an input/output buffer in which a plurality of input-/output buffer cells are provided to surround said internal logic gate portion; and
a plurality of bonding pads respectively provided in the peripheral portions of said semiconductor chip corresponding to said plurality of input/output buffer cells;
each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a first direction from said bonding pads to said internal logic gate portion;
a plurality of transistors in said first transistor region of the first conductivity type for output and a plurality of transistors in said second transistor region of the second conductivity type for output being regularly disposed in said first direction with respective transistors of said first conductivity type being paired with respective transistors of said second conductivity type to form functional output buffers;
a plurality of transistors in said third transistor region of the first conductivity type for input and logic and a plurality of transistors in said fourth transistor region of the second conductivity type for input and logic being regularly and sequentially arranged in a second direction perpendicularly intersecting said first direction; said transistor regions for output being positioned adjacent each other and said transistor regions for input and logic being positioned adjacent each other.

18. A semiconductor integrated circuit device comprising:
an internal logic gate portion provided in the central portion of a semiconductor chip;
an input/output buffer in which a plurality of input-/output buffer cells are provided to surround said internal logic gate portion; and
a plurality of bonding pads respectively provided in the peripheral portions of said semiconductor chip corresponding to said plurality of input/output buffer cells;
each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic, the first through fourth transistor regions being disposed in a first direction from said bonding pads to said internal logic gate portion;
a plurality of transistors in said first transistor region of the first conductivity type for output and a plurality of transistors in said second transistor region of the second conductivity type for output being regularly and sequentially disposed in a second direction perpendicularly intersecting said first direction with respective transistors of said conductivity type being paired with respective transistors of said second conductivity type to form functional output buffers;
a plurality of transistors in said third transistor region of the first conductivity type for input and logic and a plurality of transistors in said fourth transistor region of the second conductivity type for input and logic being regularly and sequentially arranged in said second direction; said transistor regions for output being positioned adjacent each other and said transistor regions for input and logic being positioned adjacent each other.

19. A semiconductor integrated circuit device comprising:
an internal logic gate portion provided in the central portion of a semiconductor chip;
an input/output buffer in which a plurality of input-/output buffer cells are provided to surround said internal logic gate portion; and
a plurality of bonding pads respectively provided in the peripheral portions of said semiconductor chip corresponding to said plurality of input/output buffer cells;

each of said input/output buffer cells comprising a first transistor region of a first conductivity type for output, a second transistor region of a second conductivity type for output, a third transistor region of the first conductivity type for input and logic, and a fourth transistor region of the second conductivity type for input and logic;

a continuous power supply bus formed over said first transistor region of said first conductivity type for output on all said output buffer cells within each said input/output buffer, said continuous power supply bus disposed in a direction perpendicular to a direction from said bonding pads to said internal logic gate portion;

and a continuous ground bus formed adjacent said continuous power supply bus and over said second transistor region of said second conductivity type for output on all said output buffer cells within each input/output buffer, said continuous ground bus disposed in a direction perpendicular to a direction from said bonding pads to said internal logic gate portion.

20. A semiconductor integrated circuit comprising an internal logic gate portion provided in the central portion of a semiconductor chip, a plurality of bonding pads provided at the peripheral portions of the semiconductor chip, and a plurality of input/output buffer cells provided between the logic gate portion and the bonding pads, each input/output buffer cell corresponding to a bonding pad, the input/output buffer cells each comprising regions of a first conductivity type for output and input and logic and regions, of a second conductivity type for input and output and logic, all said regions being arranged in a single line in first direction from the bonding pads to the logic gate portion, characterized in that the regions of the first conductivity type comprises a first transistor region of the first conductivity type for output and a second transistor region of the first conductivity type for input and logic being isolated from the first transistor region, that the regions of the second conductivity type comprises a third transistor region of the second conductivity type for output adjacent to the first transistor region and a fourth transistor region of the second conductivity type for input and logic isolated from the third transistor region and adjacent to the second transistor region, individual transistors of regions of the first conductivity type having the same shape on said semiconductor chip and being disposed in the same direction and individual transistors of regions of the second conductivity type having the same shape on said semiconductor chip and being arranged in the same direction, and that the first through fourth transistor regions are arranged in a line from a corresponding bonding pad to the logic gate portion.

* * * * *